(12) United States Patent
Sofer et al.

(10) Patent No.: US 6,643,181 B2
(45) Date of Patent: Nov. 4, 2003

(54) METHOD FOR ERASING A MEMORY CELL

(75) Inventors: Yair Sofer, Tel-Aviv (IL); Boaz Eitan, Ra'anana (IL)

(73) Assignee: Saifun Semiconductors Ltd., Netanya (IL)

(*) Notice: Subject to any disclaimer, the term of this patent is extended or adjusted under 35 U.S.C. 154(b) by 0 days.

(21) Appl. No.: 09/983,510

(22) Filed: Oct. 24, 2001

(65) Prior Publication Data

US 2003/0076710 A1 Apr. 24, 2003

(51) Int. Cl.[7] .............................................. G11C 16/06
(52) U.S. Cl. ........................ 365/185.22; 365/185.19; 365/185.29
(58) Field of Search ..................... 365/185.22, 185.19, 365/185.29, 185.01

(56) References Cited

U.S. PATENT DOCUMENTS

| | | |
|---|---|---|
| 3,895,360 A | 7/1975 | Cricchi et al. |
| 4,016,588 A | 4/1977 | Ohya et al. |
| 4,017,888 A | 4/1977 | Christie et al. |
| 4,151,021 A | 4/1979 | McElroy |
| 4,173,766 A | 11/1979 | Hayes |
| 4,173,791 A | 11/1979 | Bell |
| 4,281,397 A | 7/1981 | Neal et al. |
| 4,306,353 A | 12/1981 | Jacobs et al. |
| 4,342,149 A | 8/1982 | Jacobs et al. |
| 4,360,900 A | 11/1982 | Bate |
| 4,380,057 A | 4/1983 | Kotecha et al. |
| 4,388,705 A | 6/1983 | Sheppard |
| 4,389,705 A | 6/1983 | Sheppard |
| 4,435,786 A * | 3/1984 | Tickle .................. 365/185.07 |
| 4,471,373 A | 9/1984 | Shimizu et al. |
| 4,521,796 A | 6/1985 | Rajkanan et al. |
| 4,527,257 A | 7/1985 | Cricchi |
| 4,586,163 A | 4/1986 | Koike |
| 4,630,085 A | 12/1986 | Koyama |
| 4,667,217 A | 5/1987 | Janning |

(List continued on next page.)

FOREIGN PATENT DOCUMENTS

| | | |
|---|---|---|
| EP | 0693781 | 1/1996 |
| EP | 0751560 | 1/1997 |
| EP | 1073120 | 1/2001 |
| GB | 2157489 | 10/1985 |
| JP | 04226071 | 8/1992 |
| JP | 04291962 | 10/1992 |
| JP | 05021758 | 1/1993 |
| JP | 07193151 | 7/1995 |
| JP | 09162314 | 6/1997 |
| WO | WO 96/15553 | 5/1996 |
| WO | WO 99/31670 | 6/1999 |

OTHER PUBLICATIONS

U.S. patent application Ser. No. 08/902,890, Eitan, filed May 4, 2000.
U.S. patent application Ser. No. 08/905,286, Eitan, filed Jul. 30, 1997.
U.S. patent application Ser. No. 09/082,280, Eitan, filed May 20, 1998.

(List continued on next page.)

*Primary Examiner*—Hoai Ho
(74) *Attorney, Agent, or Firm*—Eitan, Pearl, Latzer & Cohen Zedek, LLP.

(57) ABSTRACT

A method for erasing a non-volatile memory cell array, the method including applying an erase pulse to at least one bit of at least one memory cell of the array, erase verifying the at least one bit with a first erase verify level, and if the bit has passed the first erase verify level, applying at least one more erase pulse to the at least one bit.

26 Claims, 3 Drawing Sheets

U.S. PATENT DOCUMENTS

| | | |
|---|---|---|
| 4,742,491 A | 5/1988 | Liang et al. |
| 4,780,424 A | 10/1988 | Holler et al. |
| 4,847,808 A | 7/1989 | Kobatake |
| 4,870,470 A | 9/1989 | Bass, Jr. et al. |
| 4,916,671 A | 4/1990 | Ichiguchi |
| 4,941,028 A | 7/1990 | Chen et al. |
| 5,021,999 A | 6/1991 | Kohda et al. |
| 5,075,245 A | 12/1991 | Woo et al. |
| 5,117,389 A | 5/1992 | Yiu |
| 5,159,570 A | 10/1992 | Mitchell et al. |
| 5,168,334 A | 12/1992 | Mitchell et al. |
| 5,172,338 A | 12/1992 | Mehrotra et al. |
| 5,175,120 A | 12/1992 | Lee |
| 5,214,303 A | 5/1993 | Aoki |
| 5,241,497 A | 8/1993 | Komarek |
| 5,260,593 A | 11/1993 | Lee |
| 5,268,861 A | 12/1993 | Hotta |
| 5,289,412 A | 2/1994 | Frary et al. |
| 5,293,563 A | 3/1994 | Ohta |
| 5,295,108 A | 3/1994 | Higa |
| 5,305,262 A | 4/1994 | Yoneda |
| 5,311,049 A | 5/1994 | Tsuruta |
| 5,315,541 A | 5/1994 | Harari et al. |
| 5,338,954 A | 8/1994 | Shimoji |
| 5,345,425 A | 9/1994 | Shikatani |
| 5,349,221 A | 9/1994 | Shimoji |
| 5,350,710 A | 9/1994 | Hong et al. |
| 5,359,554 A | 10/1994 | Odake et al. |
| 5,393,701 A | 2/1995 | Ko et al. |
| 5,394,355 A | 2/1995 | Uramoto et al. |
| 5,399,891 A | 3/1995 | Yiu et al. |
| 5,400,286 A * | 3/1995 | Chu et al. .............. 365/185.19 |
| 5,412,601 A | 5/1995 | Sawada et al. |
| 5,414,693 A | 5/1995 | Ma et al. |
| 5,418,176 A | 5/1995 | Yang et al. |
| 5,418,743 A | 5/1995 | Tomioka et al. |
| 5,422,844 A | 6/1995 | Wolstenholme et al. |
| 5,424,978 A | 6/1995 | Wada et al. |
| 5,426,605 A | 6/1995 | Van Berkel et al. |
| 5,434,825 A | 7/1995 | Harari |
| 5,440,505 A | 8/1995 | Fazio et al. |
| 5,450,341 A | 9/1995 | Sawada et al. |
| 5,450,354 A | 9/1995 | Sawada et al. |
| 5,455,793 A | 10/1995 | Amin et al. |
| 5,467,308 A | 11/1995 | Chang et al. |
| 5,477,499 A | 12/1995 | Van Buskirk et al. |
| 5,495,440 A | 2/1996 | Asakura |
| 5,518,942 A | 5/1996 | Shrivastava |
| 5,521,870 A | 5/1996 | Ishikawa |
| 5,523,251 A | 6/1996 | Hong |
| 5,523,972 A | 6/1996 | Rashid et al. |
| 5,553,018 A | 9/1996 | Wang et al. |
| 5,563,823 A | 10/1996 | Yiu et al. |
| 5,583,808 A | 12/1996 | Brahmbhatt |
| 5,599,727 A | 2/1997 | Hakozaki et al. |
| 5,623,438 A | 4/1997 | Guritz et al. |
| 5,654,568 A | 8/1997 | Nakao |
| 5,656,513 A | 8/1997 | Wang et al. |
| 5,661,060 A | 8/1997 | Gill et al. |
| 5,683,925 A | 11/1997 | Irani et al. |
| 5,712,814 A | 1/1998 | Fratin et al. |
| 5,726,946 A | 3/1998 | Yamagata et al. |
| 5,751,037 A | 5/1998 | Aozasa et al. |
| 5,754,475 A | 5/1998 | Bill et al. |
| 5,768,192 A | 6/1998 | Eitan |
| 5,777,919 A | 7/1998 | Chi-Yung et al. |
| 5,784,314 A | 7/1998 | Sali et al. |
| 5,787,036 A | 7/1998 | Okazawa |
| 5,793,079 A | 8/1998 | Georgescu et al. |
| 5,812,449 A | 9/1998 | Song |
| 5,825,686 A | 10/1998 | Schmitt-Landsiedel et al. |
| 5,834,851 A | 11/1998 | Ikeda et al. |
| 5,836,772 A | 11/1998 | Chang et al. |
| 5,841,700 A | 11/1998 | Chang |
| 5,847,441 A | 12/1998 | Cutter et al. |
| 5,862,076 A | 1/1999 | Eitan |
| 5,864,164 A | 1/1999 | Wen |
| 5,870,335 A | 2/1999 | Khan et al. |
| 5,886,927 A | 3/1999 | Takeuchi |
| 5,920,507 A | 7/1999 | Takeuchi et al. |
| 5,946,558 A | 8/1999 | Hsu |
| 5,949,728 A | 9/1999 | Liu et al. |
| 5,963,412 A | 10/1999 | En |
| 5,963,465 A | 10/1999 | Eitan |
| 5,969,989 A | 10/1999 | Iwahashi |
| 5,973,373 A | 10/1999 | Krautschneider et al. |
| 5,990,526 A | 11/1999 | Bez et al. |
| 5,991,202 A | 11/1999 | Derhacobian et al. |
| 6,011,725 A | 1/2000 | Eitan |
| 6,018,186 A | 1/2000 | Hsu |
| 6,020,241 A | 2/2000 | You et al. |
| 6,028,324 A | 2/2000 | Su et al. |
| 6,030,871 A | 2/2000 | Eitan |
| 6,034,403 A | 3/2000 | Wu |
| 6,063,666 A | 5/2000 | Chang et al. |
| 6,097,639 A | 8/2000 | Choi et al. |
| 6,128,226 A | 10/2000 | Eitan et al. |
| 6,134,156 A | 10/2000 | Eitan |
| 6,137,718 A | 10/2000 | Reisinger |
| 6,163,048 A | 12/2000 | Hirose et al. |
| 6,201,282 B1 | 3/2001 | Eitan |
| 6,292,394 B1 | 9/2001 | Cohen et al. |
| 6,304,485 B1 | 10/2001 | Harari et al. |
| 6,307,807 B1 * | 10/2001 | Sakui et al. .............. 365/238.5 |
| 6,396,741 B1 | 5/2002 | Bloom et al. |

OTHER PUBLICATIONS

U.S. patent application Ser. No. 09/211,981, Eitan, filed Dec. 14, 1998.

U.S. patent application Ser. No. 09/348,720, Eitan, filed Jul. 6, 1999.

U.S. patent application Ser. No. 09/413,408, Eitan, filed Oct. 6, 1999.

U.S. patent application Ser. No. 09/730,586, Bloom et al., filed Dec. 7, 2000.

U.S. patent application Ser. No. 09/536,125, Eitan et al., filed Mar. 28, 2000.

Chan et al., "A True Single–Transistor Oxide–Nitride–Oxide EEPROM Device," *IEEE Electron Device Letters*, vol. EDL–8, No. 3, Mar., 1987.

Chang, J., "Non Volatile Semiconductor Memory Devices," *Proceedings of the IEEE*, vol. 64 No. 7, pp. 1039–1059, Jul., 1976.

Eitan et al., "Hot–Electron Injection into the Oxide in n–Channel MOS Devices," *IEEE Transactions on Electron Devices*, vol. ED–28, No. 3, pp. 328–340, Mar. 1981.

Lee, H., "A New Approach For the Floating–Gate MOS NonVolatile Memory", *Applied Physics Letters*, vol. 31, No. 7, pp. 475–476, Oct. 1977.

Ma et al., "A dual–bit Split–Gate EEPROM (DSG) Cell in Contactless Array for Single–Vcc High Density Flash Memories," *IEEE*, pp. 3.5.1–3.5.4, 1994.

Ohshima et al., "Process and Device Technologies for 16Mbit Eproms with Large—Tilt—Angle implanted P–Pocket Cell," *IEEE*, CH2865–4/90/0000–0095, pp. 5.2.1–5.2.4, Dec., 1990.

Ricco, Bruno et al., "Nonvolatile Multilevel Memories for Digital Applications," *IEEE*, vol. 86, No. 12, pp. 2399–2421, Dec., 1998.

Roy, Anirban "Characterization and Modeling of Charge Trapping and Retention in Novel Multi–Dielectric Nonvolatile Semiconductor Memory Devices," Doctoral Dissertation, Sherman Fairchild Center, Department of Computer Science and Electrical Engineering, pp. 1–35, 1989.

"2 Bit/Cell EEPROM Cell Using Band–To–Band Tunneling For Data Read–Out," *IBM Technical Disclosure Bulletin*, U.S. IBM Corp. NY vol. 35, No. 4B, ISSN:0018–8689, Sep., 1992.

Tseng, Hsing–Huang et al., "Thin CVD Stacked Gate Dielectric for ULSI Technology", *IEEE*, 0–7803–1450–6, 1993.

Pickar, K.A., "Ion Implantation in Silicon," *Applied Solid State Science*, vol. 5, R. Wolfe Edition, Academic Press, New York, 1975.

Bhattacharyya et al., "FET Gate Structure for Nonvolatile N–Channel Read–Mostly Memory Device," *IBM Technical Disclosure Bulletin*, U.S. IBM Corp. vol. 18, No. 6, p. 1768, Nov., 1975.

Bude et al., "EEPROM/Flash Sub 3.0 V Drain–Source Bias Hot carrier Writing", *IEDM* 95, pp. 989–992.

Bude et al., "Secondary Electron Flash—a High Performance, Low Power Flash Technology for 0.35 um and Below", *IEDM* 97, pp. 279–282.

Bude et al., "Modeling Nonequilibrium Hot Carrier Device Effects", *Conference of Insulator Specialists of Europe, Sweden*, Jun., 1997.

* cited by examiner

METHOD FOR ERASING A MEMORY CELL

FIELD OF THE INVENTION

The present invention relates generally to erasing memory cells of non-volatile memory arrays, and particularly to methods for erasing a bit of a memory cell so as to reduce a drift of threshold voltage thereafter and increasing reliability.

BACKGROUND OF THE INVENTION

Memory cells are used in the implementation of many types of electronic devices and integrated circuits. These devices include microprocessors, static random access memories (SRAMs), erasable, programmable read only memories (EPROMs), electrically erasable, programmable read only memories (EEPROMs), flash EEPROM memories, programmable logic devices (PLDs), field programmable gate arrays (FPGAs), application specific integrated circuits (ASICs), among others. Memory cells are used to store the data and other information for these and other integrated circuits.

Memory cells generally comprise transistors with programmable threshold voltages. For example, a floating gate transistor or a split gate transistor has a threshold voltage ($V_t$) that is programmed or erased by charging or discharging a floating gate located between a control gate and a channel in the transistor. Data is written in such memory cells by charging or discharging the floating gates of the memory cells to achieve threshold voltages corresponding to the data.

The act of programming the cell involves charging the floating gate with electrons, which increases the threshold voltage $V_t$. The act of erasing the cell involves removing electrons from the floating gate, which decreases the threshold voltage $V_t$.

A binary memory stores one bit of data per memory cell. Accordingly, floating gate transistors in binary memory cells have two distinguishable states, a high threshold voltage state and a low threshold voltage state. A memory cell having a threshold voltage above a cut-off threshold voltage value, referred to as a read reference voltage level, is considered to be in a programed state. Conversely, a memory cell having a threshold voltage below the read reference voltage level is considered to be in an erased state.

It is noted that a multibit-per-cell memory stores multiple bits per memory cell. Accordingly, a range of threshold voltages for a memory cell is divided into a number of states corresponding to the possible multibit data values stored in the memory cell.

A concern in non-volatile semiconductor memory is drift or unintended changes in the threshold voltages of memory cells. For example, over time, charge tends to leak from the floating gates of memory cells and change the threshold voltages of the cells. Charge leakage decreases the threshold voltage of an n-channel memory cell. Alternatively, a floating gate or an insulator surrounding the floating gate can collect or trap charge and increase the threshold voltage of a cell. Further, operation of the memory, for example, programming or erasing, stresses or disturbs memory cells not being accessed and can change threshold voltages. Changes in the threshold voltage are a problem because the state of the memory cell and the data value stored in the memory cell can change and create a data error. Such data errors are intolerable in many memory applications. The problem is worse for multibit-per-cell memories than for binary memories because the range of threshold voltages corresponding to a particular state is typically smaller in a multibit-per-cell memory which makes changes in the state of the memory cell more likely.

Another type of non-volatile cell is a nitride, read only memory (NROM) cell, described in Applicant's copending U.S. patent application Ser. No. 08/905,286, entitled "Two Bit Non-Volatile Electrically Erasable And Programmable Semiconductor Memory Cell Utilizing Asymmetrical Charge Trapping". Programming and erasing of NROM cells are described in Applicant's copending U.S. patent application Ser. No. 09/730,586, filed Dec. 7, 2000 and entitled "Programming And Erasing Methods For An NROM Array", which is a continuation-in-part application of Applicant's copending U.S. patent application Ser. No. 09/563,923, filed May 4, 2000 and entitled "Programming Of Nonvolatile Memory Cells". The disclosures of all the above-referenced patent documents are incorporated herein by reference.

Unlike a floating gate cell, the NROM cell has two separated and separately chargeable areas. Each chargeable area defines one bit. The separately chargeable areas are found within a nitride layer formed in an oxide-nitride-oxide (ONO) sandwich underneath a gate. When programming a bit, channel hot electrons are injected into the nitride layer. The negative charge raises the threshold voltage of the cell, if read in the reverse direction. For NROM cells, each bit is read in the direction opposite (a "reverse read") to that of its programming direction. An explanation of the reverse read process is described in U.S. patent application Ser. No. 08/905,286, mentioned above.

One procedure for erasing bits in NROM cells is described in Applicant's copending U.S. patent application Ser. No. 09/730,586, mentioned hereinabove. The method comprises applying erase pulses that are adapted to the current state of the memory array. Specifically, this involves measuring the current threshold voltage level of a bit to be erased (the measurement being made with an accuracy within a predetermined range), and selecting an incremental drain voltage level of the next erase pulse, which is to be applied to that bit, in accordance with the measured current threshold voltage level.

The following is an illustrative example of erasing bits in a block of NROM cells, according to the aforementioned method. First, the block to be erased is read and then its erase state is checked. If all of the bits of the block are erased already, the process is finished. If the block requires further erasure, an erase pulse is provided, typically with predefined gate and drain voltages, which may be defined in accordance with any suitable criteria. The read level may then be subsequently decreased from the program verify level (i.e., the level of fully programmed bits) towards the erase verify level (i.e., fully erased) to determine how much erasure has occurred and how much more needs to occur.

Specifically, the read voltage level may be set to the program verify (PV) level and the block is read. If all of the bits of the block pass the read operation, the read voltage level is reduced as long as it has not yet reached the erase verify level. If the read operation is successful at the erase verify level, then the block has been fully erased and the process finishes. However, if the read operation fails at some point, the drain voltage level is increased in accordance with any suitable criteria, and another erase pulse is applied using the new drain voltage level. The erasure process continues until the erase pulses have successfully erased the bits that are required to be erased. The process may comprise checking if the number of erase pulses has not exceeded a maximum. If the maximum has been exceeded, then an error flag may be set and the process may be stopped.

As mentioned hereinabove for non-volatile semiconductor memory cells, a concern with NROM cells is drift or unintended changes in the threshold voltages of memory cells. For example, over time at room temperature, bits that are supposed to be in an erased state may experience an increase in threshold voltage.

There are several problems associated with the drift problem. The drift causes a loss in the margin of voltage level between the erased state voltage level and the read reference level. Accordingly, in the prior art, the erase verify level may be set at a certain low voltage level, taking into account a factor of safety so as to distance the erased state voltage level from the read reference level. This is referred to as maintaining a "window" between the erased state voltage level and the read reference level. There may be likewise a "window" between the programmed state voltage level and the read reference level. One way of combating the margin loss would be to maintain a large window that would separate the erased state voltage level from the read reference level even after drift in the erased state voltage level over time. However, this in turn causes other problems. A larger window may lower reliability by detrimentally affecting cycling and retention. In addition, the larger window necessitates longer write times, thereby causing a loss in performance.

SUMMARY OF THE INVENTION

The present invention seeks to provide methods for erasing a bit of a memory cell so as to reduce the drift of the threshold voltage thereafter. In accordance with a preferred embodiment of the present invention, an erase pulse is applied to a bit and the bit is read to check if the bit has passed an erase verify level. In contrast to the prior art, if the bit has passed the erase verify level, then at least one more erase pulse is applied to that bit.

The extra erase pulse may be applied with the same voltage levels of gate and drain and for the same time duration as the previous erase pulse. Alternatively, any or all of the values may be changed for the extra pulse.

In accordance with another embodiment of the invention, reliability may be further improved by applying the at least one extra erase pulse only if the bit fails a second verify level, as is described in detail further hereinbelow.

There is thus provided in accordance with a preferred embodiment of the invention a method for erasing a bit of a memory cell in a non-volatile memory cell array, the method including applying an erase pulse to at least one bit of at least one memory cell of the array, erase verifying the at least one bit with a first erase verify level, and if the bit has passed the first erase verify level, applying at least one more erase pulse to the at least one bit.

In accordance with one embodiment of the invention the method includes applying an erase pulse of an equal magnitude as an erase pulse applied to the at least one bit just prior to applying the at least one more erase pulse.

Alternatively, in accordance with another embodiment of the invention, the method includes applying an erase pulse of a lower magnitude than an erase pulse applied to the at least one bit just prior to applying the at least one more erase pulse.

Alternatively, in accordance with yet another embodiment of the invention, the method includes applying an erase pulse of a greater magnitude than an erase pulse applied to the at least one bit just prior to applying the at least one more erase pulse.

In accordance with a preferred embodiment of the invention the applying at least one more erase pulse includes applying an erase pulse for an equal, lower or greater time duration as an erase pulse applied to the at least one bit just prior to applying the at least one more erase pulse.

Further in accordance with a preferred embodiment of the invention the method includes, prior to applying the at least one more erase pulse to the at least one bit, erase verifying the at least one bit with a second erase verify level, the second erase verify level being at a lower voltage level than the first erase verify level or the same.

Still further in accordance with a preferred embodiment of the invention the method includes applying at least one more erase pulse to the at least one bit only if the bit has passed the first erase verify level and failed the second erase verify level.

In accordance with a preferred embodiment of the invention the method further includes, after erase verifying the at least one bit, waiting a period of time prior to applying the at least one more erase pulse to the at least one bit.

In accordance with a preferred embodiment of the invention applying the erase pulse (or the at least one more erase pulse) includes erasing with hot hole injection.

There is also provided in accordance with a preferred embodiment of the invention a non-volatile memory cell array including a plurality of transistor memory cells, a power supply adapted to generate erase pulses to bits of the cells, and a controller in communication with the power supply, the controller adapted to perform the steps of applying an erase pulse to at least one bit of at least one memory cell of the array, erase verifying the at least one bit with a first erase verify level, and if the bit has passed the first erase verify level, applying at least one more erase pulse to the at least one bit.

In accordance with a preferred embodiment of the invention the memory cells include nitride read only memory (NROM) cells.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

Figure 1:
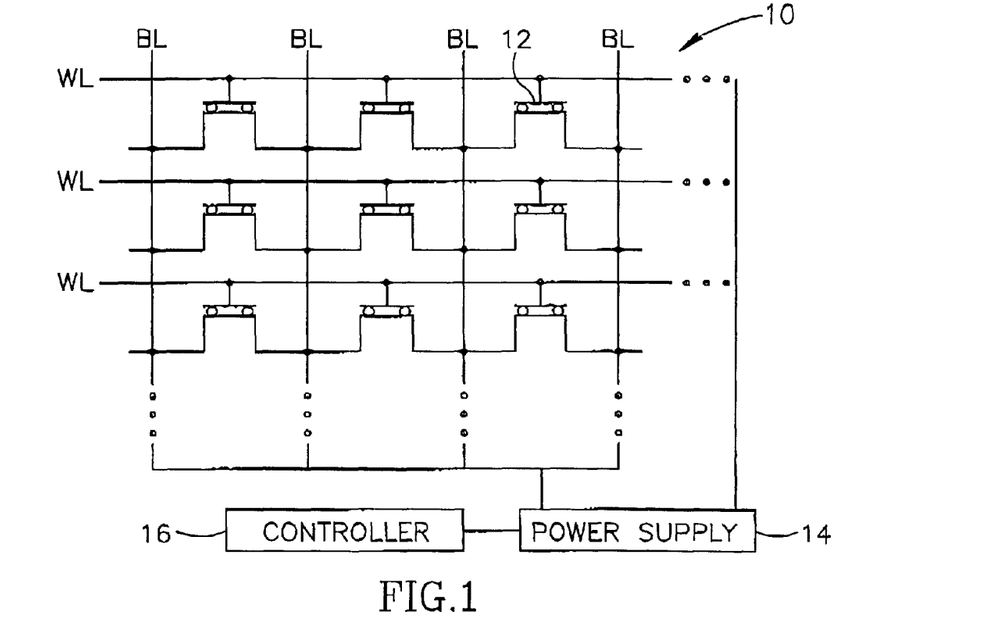
FIG. 1 is a schematic illustration of non-volatile memory cell array, constructed and operative in accordance with a preferred embodiment of the present invention.

Reference is now made to FIG. 1, which illustrates a non-volatile memory cell array 10 constructed and operative in accordance with a preferred embodiment of the present invention. Array 10 may be an EEPROM array, for example. Array 10 comprises a multiplicity of memory cells 12 each connected to an associated word line, generally designated WL, and two bit lines, generally designated BL. A single memory cell 12 may store a single bit or multiple bits.

In accordance with one embodiment of the present invention, memory cells 12 are nitride read only memory (NROM) cells. Although the present invention is not limited to NROM cells, use of NROM cells provides certain advantages described hereinbelow.

A power supply 14 is adapted to generate erase pulses to erase bits of memory cells 12. A controller 16 is preferably in communication with power supply 14 to control erasure of the bits, as is described in detail hereinbelow.

Figure 2:
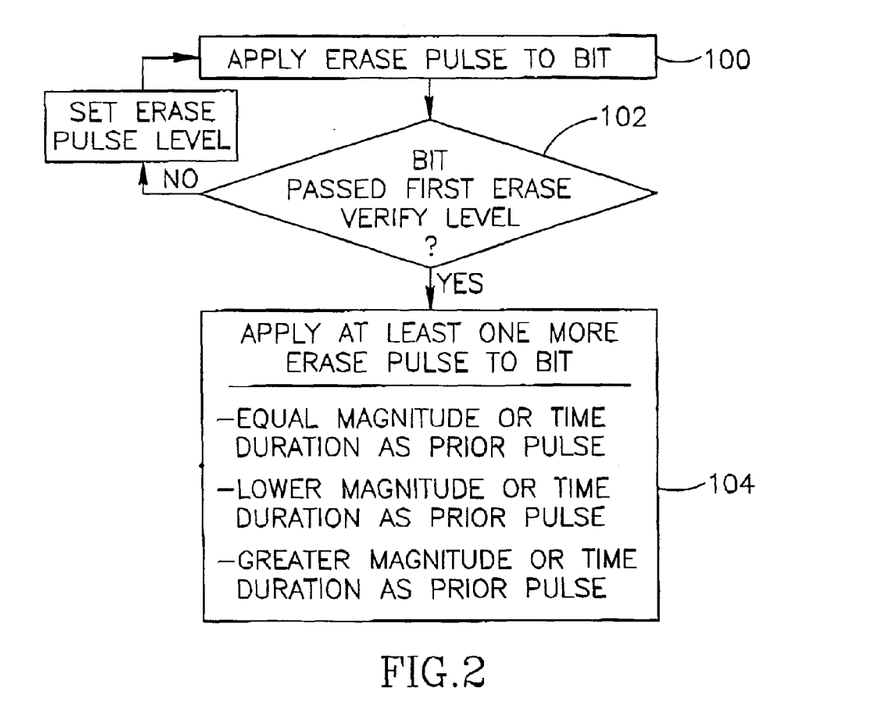
FIG. 2 is a flow chart of a method for erasing a bit of a memory cell in the non-volatile memory cell array, in accordance with a preferred embodiment of the present invention.

Reference is now made to FIG. 2, which illustrates a method for erasing a bit of the memory cell 12 in array 10, in accordance with a preferred embodiment of the present invention.

An erase pulse is applied (by means of power supply 14 and controller 16, FIG. 1) to one or more bits of one or more memory cells 12 of array 10 (step 100). Application of erase pulses to a selected bit in the preferred embodiment generally comprises application of a negative gate voltage to the word line of the bit, a positive drain voltage to the bit line serving as drain, and a floating voltage to the bit line serving as source. The magnitude and time duration of the negative gate voltage and positive drain voltage, inter alia, affect the amount of erasure of the bit. As mentioned hereinabove, one procedure for applying erase pulses is described in Applicant's copending U.S. patent application Ser. No. 09/730, 586.

The erase pulse lowers the threshold voltage of the bit. The threshold voltage of any bit is generally checked by reading the bit, such as with a sense amplifier (not shown), as is known in the art. If the threshold voltage of the bit is more negative than a "read reference" voltage level, then that bit is considered to be in an erased state. Conversely, if the threshold voltage of the bit is more positive than the read reference voltage level, then that bit is considered to be in a programmed state.

Accordingly, after applying the erase pulse (step 100), the bit or bits are erase verified with a first erase verify level (step 102). "Passing" the first erase verify level means that the threshold voltage of the particular bit is read and found to be at or below the first erase verify reference level. "Failing" the first erase verify level means that the threshold voltage of the particular bit is read and found to be above the first erase verify reference level. If the particular bit has failed the first erase verify level, then the method returns to step 100 for another application of an erase pulse until the bit passes the first erase verify level.

In accordance with a preferred embodiment of the present invention, if the particular bit has passed the first erase verify level, then at least one more erase pulse is applied to that bit (step 104). The one or more additional erase pulses may be of an equal, less or greater magnitude than the erase pulse applied just prior to step 104. "Greater magnitude" means more positive BL voltage or more negative WL voltage or both. Additionally or alternatively, the one or more additional erase pulses may be applied at an equal, less or greater time duration than the erase pulse applied just prior to step 104. For example, if the previous erase pulse was $V_g=-5$ V and $V_d=6$ V for a duration of 250 $\mu$sec, then the additional erase pulse may be $V_g=-5.2$ V and $V_d=6$ V for a duration of 250 $\mu$sec. Another alternative may be $V_g=-5$ V and $V_d=6.3$ V for a duration of 250 $\mu$sec. Another alternative may be $V_g=-5.5$ V and $V_d=6.3$ V for a duration of 250 $\mu$sec. Yet another alternative may be $V_g=-5$ V and $V_d=6$ V for a duration of 500 $\mu$sec. The process continues until all bits that are supposed to be erased are erased in accordance with steps 100, 102 and 104, as described above. The bits may be erased one at a time or a multiplicity at a time.

Figure 3:
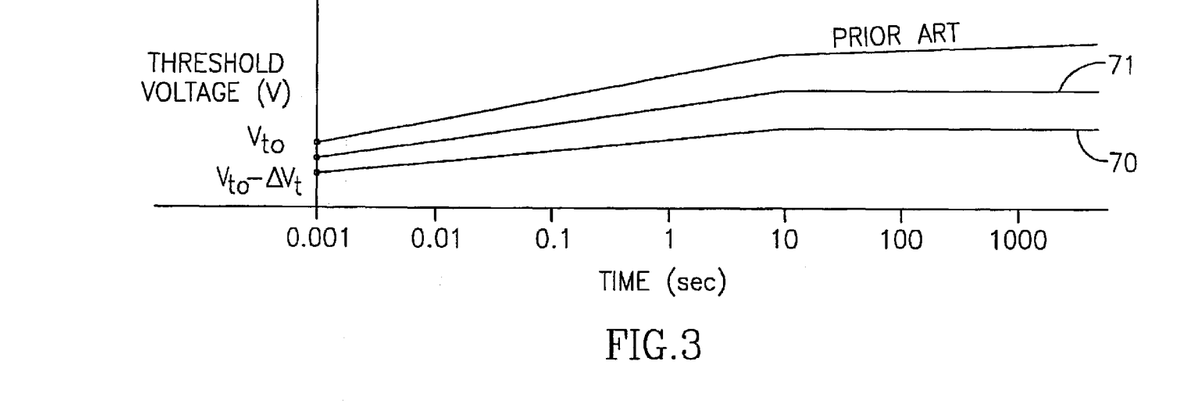
FIG. 3 is a simplified graph of the drift characteristics of the threshold voltage level of a bit in an erased state after a small number of cycles and a large number of cycles, comparing the drift characteristics of the prior art with the drift characteristics after application of an additional erase pulse in accordance with a preferred embodiment of the present invention.

Advantages of applying the additional erase pulse may be appreciated by referring to FIG. 3, which illustrates a graph of the drift characteristics of the threshold voltage level of a bit in an erased state, comparing the drift characteristics of the prior art with the drift characteristics after application of the additional erase pulse in accordance with a preferred embodiment of the present invention.

In the prior art, a bit may be initially erased so as to have a threshold voltage $V_{t0}$. This threshold voltage drifts upwards, i.e., increases, with time, typically, but not necessarily, at a rate of about 50 mV per decade of time in a log scale, and may eventually approach an upper limit asymptotically. FIG. 3 also illustrates a threshold voltage drift curve, labeled with reference numeral 70, of the same bit with one additional erase pulse applied thereto after passing erase verify. For example, application of the additional erase pulse may last 250 $\mu$sec and comprise applying a negative gate voltage $V_g$ approximately in the range of $-5$ to $-7$V to the word line connected to the bit, and a positive drain voltage $V_d$ in the range of approximately 4–6V to the drain bit line connected to the bit, with the source bit line being floating or driven. The additional erase pulse lowers the threshold voltage of the bit to $V_{t0}-\Delta V_t$, wherein $\Delta V_t$ may be in the range of 300–400 mV, for example. These are merely exemplary voltage levels and time duration, and the skilled artisan will readily appreciate that the invention is not at all limited to these values.

Threshold voltage drift curve 70 is an example of a drift for a small number of program and erase cycles. FIG. 3 also illustrates a drift curve 71, which is exemplary of a drift for a large number of program and erase cycles. It is seen, as mentioned hereinabove, that the drift is greater for a small number of program and erase cycles than for a large number. Accordingly, the extra pulse is more effective for a small number of cycles since the reduction of the threshold with the extra pulse (i.e., $\Delta V_t$) is larger than after many cycles. As described further hereinbelow, the extra erase pulse may be applied after a wait period so as not to increase the retention loss of the programmed state, and thus further improve reliability.

Figure 4:
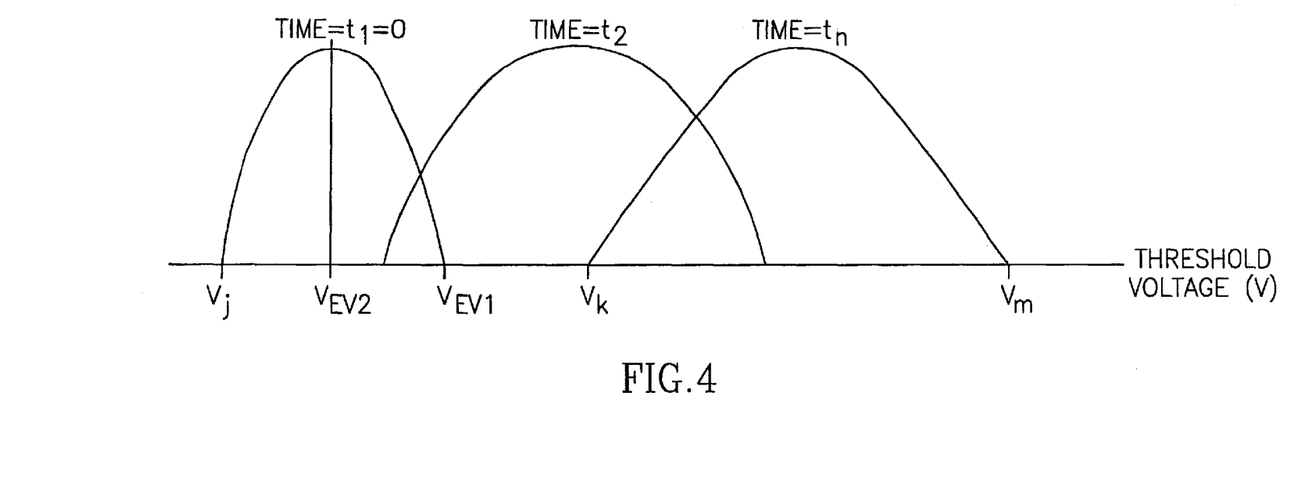
FIG. 4 is a simplified illustration of a distribution of threshold voltage levels of a plurality of memory cells before application of an additional erase pulse in accordance with a preferred embodiment of the present invention, and after approaching an asymptotic threshold voltage level.

Reference is now made to FIG. 4, which illustrates a distribution of threshold voltage levels of a plurality of memory cells 12 of memory cell array 10. At $t_1=0$ (i.e., at the application of the one or more additional erase pulses, as described hereinabove), the threshold voltages of the erased bits are generally not all alike, but rather may cluster in a range between some voltage level $V_j$ and the first erase verify level ($V_{EV1}$). After a certain time $t_2$, the threshold voltages of the bits may drift to a different range of voltage levels. After several log-time decades, the threshold voltages of the bits may drift into a range between some voltage level $V_k$ and some other voltage level $V_m$.

It is noted that for some of the erased bits, even without the application of the extra erase pulse, the threshold voltage may be at a sufficiently low level that remains at a satisfactory low level even after drift. For these bits, the application of the additional erase pulse is unnecessary, and may lower the reliability of those bits. Accordingly, it may be advantageous to suppress application of the one or more additional erase pulses to those bits in the lower range of the cluster of threshold voltage levels. For example, those erased bits whose threshold voltage level lies between voltage level $V_j$ and a second erase verify level ($V_{EV2}$), wherein $V_{EV2} < V_{EV1}$, may eventually drift into an acceptable voltage level range, without need for applying au additional erase pulse. By suppressing application of the one or more additional erase pulses to these bits, the reliability of their programmed state may be improved.

Accordingly, the present invention provides a method for selectively applying the at least one additional erase pulse, as is now described with reference to FIG. 5.

Figure 5:
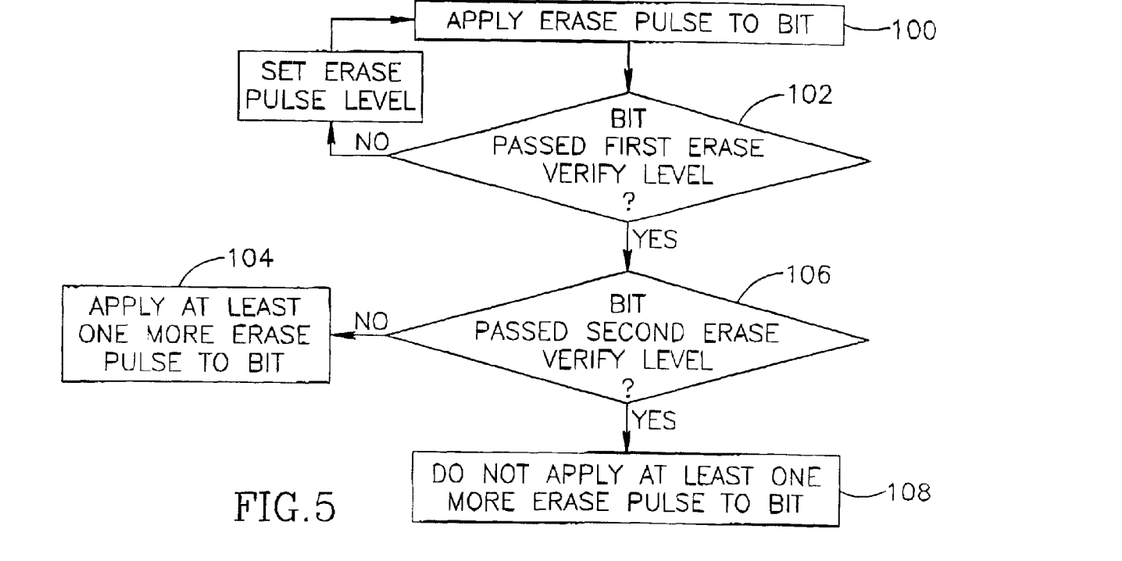
FIG. 5 is a flow chart of a method for erasing a bit of a memory cell in the non-volatile memory cell array, in accordance with another preferred embodiment of the present invention.

The method of FIG. 5 is basically the same as that of FIG. 2, except that in the method of FIG. 5, prior to step 104 (applying the at least one more erase pulse to the bit), the bit is erase verified with the second erase verify level (step 106). The at least one more erase pulse is applied to the bit (step 104) only if the bit passes the first erase verify level and fails the second erase verify level. (For example, the difference between the first erase verify level and the second erase verify level may be about 200 mV.) Otherwise, if the bit passes both the first and second erase verify levels, then no further additional erase pulse is applied (step 108). This may improve the overall reliability of the erased bits.

The present invention also provides a method for selectively applying the at least one additional erase pulse after a time delay, as is now described with reference to FIG. 6.

Figure 6:
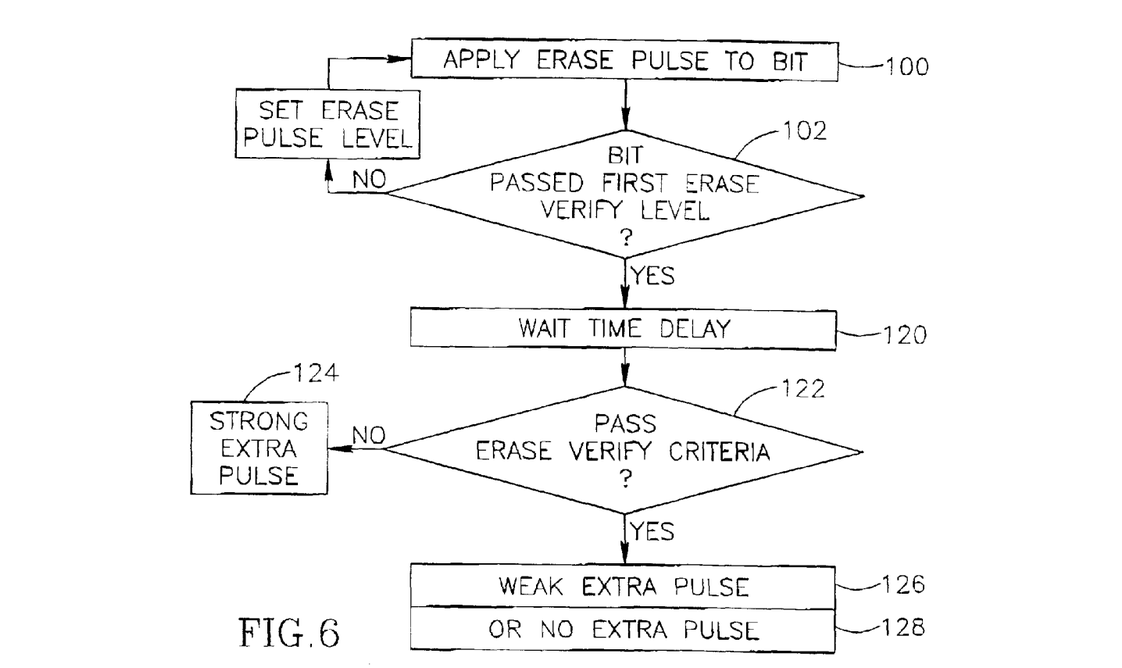
FIG. 6 is a flow chart of a method for erasing a bit of a memory cell in the non-volatile memory cell array, in accordance with yet another preferred embodiment of the present invention.

The method of FIG. 6 is basically the same as that of FIG. 2 or FIG. 5, except that in the method of FIG. 6, after the particular bit has passed the first erase verify level (step 102), there is a time delay (step 120), wherein the process waits a period of time before deciding whether to apply the at least one more erase pulse (step 122). During this waiting time, the threshold voltage of the bit may drift somewhat. This drift makes the following pulse more effective, since the increased threshold voltage represents a more programmed state with a higher vertical field. This is equivalent to increasing the negative gate by an exact amount that is determined by the cell. One advantage of the wait period is the logarithmic nature of the drift, wherein the initial wait period comprises a substantial part of the drift. The extra pulse after the wait period is self aligned in its vertical field to the drift itself. Thus, by delaying application of the one or more extra erase pulses, it may be possible to correct for any drift that occurred during the wait period and thereby further improve the overall reliability by minimizing the over erase state that degrades the programmed state retention.

The decision whether to apply the at least one more erase pulse (step 122) may comprise checking if the bit has passed the first erase verify level (as in the method of FIG. 2), or if the bit has passed both the first and second erase verify levels (as in the method of FIG. 5). It is noted that in the embodiment of FIG. 6 with the time delay, the first and second erase verify levels may be the same.

In accordance with an embodiment of the invention, different strengths of erase pulses may be used in applying the at least one more erase pulse. For example, as seen in FIG. 6, if the bit fails the criterion of step 122 (e.g., does not pass both the first and second erase verify levels), then at least one more erase pulse of a relatively strong nature (e.g., $V_g=-7$ V and $V_d=6$ V for a duration of 500 μsec) may be applied (step 124). If the bit passes the criterion of step 122 (e.g., passes just the first erase verify level), then at least one more erase pulse of a relatively weak nature (e.g., $V_g=-5$ V and $V_d=5$ V for a duration of 200 μsec) may be applied (step 126), or alternatively (e.g., if the bit passes both the first and second erase verify levels), no further additional erase pulse may be applied (step 128). As mentioned previously, the one or more additional erase pulses may be of an equal, less or greater magnitude or time duration than the previously applied erase pulse. For example, if the previous erase pulse was $V_g=-5$ V and $V_d=6$ V for a duration of 250 μsec, then the additional erase pulse may be $V_g=-5.2$ V and $V_d=6$ V for a duration of 250 μsec. Another alternative may be $V_g=-5$ V and $V_d=6.3$ V for a duration of 250 μsec. Another alternative may be $V_g=-5.5$ V and $V_d=6.3$ V for a duration of 250 μsec. Yet another alternative may be $V_g=-5$ V and $V_d=6$ V for a duration of 500 μsec. It is noted that in flash memories, the wait period may be as long as 100 msec, for example.

The methods of the present invention that lower the initial threshold voltage of the erased bit and reduce the drift slope provide several advantages over the prior art:

1. Since the initial threshold voltage is lower than the prior art, it will take longer for the threshold voltage to drift upwards than the prior art, even if the slope of the increase in threshold voltage level were the same as the prior art (the slope in actuality is not the same, as is explained below). This is mainly true for a small number of cycles, hence this technique is self-aligned with the magnitude of the drift problem.

2. Since at least one additional erase pulse is applied after passing erase verify, the erase verify level may be set at a higher voltage level than the prior art. This means that the invention may use a smaller window than the prior art to separate the erased state voltage level from the read reference level. The smaller window may increase reliability.

3. It has been found that applying the at least one additional erase pulse, particularly after a time delay, actually decreases the slope of the increase in threshold voltage level of an erased bit. For example, referring to FIG. 3, it is seen that the slope of the threshold voltage drift curve 70 is approximately half the slope of the prior art curve. Thus, the present invention synergistically diminishes the drift of the threshold voltage of an erased bit.

4. NROM memory cells arm erased with hot hole injection, in contrast to floating gate cells, which are erased with F-N tunneling. Although the present invention is not limited to NROM cells, use of NROM cells is advantageous in avoiding over-erasure, and enables using erase pulses with a larger magnitude and longer duration, if desired.

It will be appreciated by persons skilled in the art that the present invention is not limited by what has been particularly shown and described herein above. Rather the scope of the invention is defined by the claims that follow:

What is claimed is:

1. A method of erasing a bit of a memory cell in a non-volatile memory cell array, the method comprising:

applying an erase pulse to at least one bit of at least one memory cell of said array;

erase verifying said at least one bit with a first erase verify level; and if said bit is erase verified, complete erasing said bit by applying at least one more erase pulse to said at least one bit.

2. The method according to claim 1 wherein said applying at least one more erase pulse comprises applying an erase pulse of an equal magnitude as an erase pulse applied to said at least one bit just prior to applying said at least one more erase pulse.

3. The method according to claim 1 wherein said applying at least one more erase pulse comprises applying an erase pulse of a lower magnitude than an erase pulse applied to said at least one bit just prior to applying said at least one more erase pulse.

4. The method according to claim 1 wherein said applying at least one more erase pulse comprises applying an erase pulse of a greater magnitude than an erase pulse applied to said at least one bit just prior to applying said at least one more erase pulse.

5. The method according to claim 1 wherein said applying at least one more erase pulse comprises applying an erase pulse for an equal time duration as an erase pulse applied to said at least one bit just prior to applying said at least one more erase pulse.

6. The method according to claim 1 wherein said applying at least one more erase pulse comprises applying an erase pulse for a lower time duration than an erase pulse applied to said at least one bit just prior to applying said at least one more erase pulse.

7. The method according to claim 1 wherein said applying at least one more erase pulse comprises applying an erase pulse for a greater time duration than an erase pulse applied to said at least one bit just prior to applying said at least one more erase pulse.

8. The method according to claim 1 and further comprising, prior to applying said at least one more erase pulse to said at least one bit, erase verifying said at least one bit with a second erase verify level, said second erase verify level being at a lower voltage level than said first erase verify level or equal.

9. The method according to claim 8 and further comprising applying at least one more erase pulse to said at least one bit only if said bit has passed said first erase verify level and failed said second erase verify level.

10. The method according to claim 1 and further comprising, after said erase verifying said at least one bit, waiting a period of time prior to applying said at least one more erase pulse to said at least one bit.

11. The method according to claim 9 and further comprising waiting a period of time prior to applying said at least one more erase pulse to said at least one bit.

12. The method according to claim 1 wherein applying said erase pulse comprises erasing with hot hole injection.

13. The method according to claim 1 wherein applying said at least one more erase pulse comprises erasing with hot hole injection.

14. A non-volatile memory cell array comprising:
a plurality of transistor memory cells;
a power supply adapted to generate erase pulses to bits of said cells; and
a controller in communication with said power supply, said controller adapted to perform the steps of:

applying an erase pulse to at least one bit of at least one memory cell of said array;

erase verifying said at least one bit with a first erase verify level; and if said bit is erase verified, complete erasing said bit by applying at least one more erase pulse to said at least one bit.

15. The array according to claim 14 wherein said at least one more erase pulse is of an equal magnitude as an erase pulse applied to said at least one bit just prior to applying said at least one more erase pulse.

16. The array according to claim 14 wherein said at least one more erase pulse is of a lower magnitude than an erase pulse applied to said at least one bit just prior to applying said at least one more erase pulse.

17. The array according to claim 14 wherein said at least one more erase pulse is of a greater magnitude than an erase pulse applied to said at least one bit just prior to applying said at least one more erase pulse.

18. The array according to claim 14 wherein said controller is adapted to apply said at least one more erase pulse for an equal time duration as an erase pulse applied to said at least one bit just prior to applying said at least one more erase pulse.

19. The array according to claim 14 wherein said controller is adapted to apply said at least one more erase pulse for a lower time duration than an erase pulse applied to said at least one bit just prior to applying said at least one more erase pulse.

20. The array according to claim 14 wherein said controller is adapted to apply said at least one more erase pulse for a greater time duration than an erase pulse applied to said at least one bit just prior to applying said at least one more erase pulse.

21. The array according to claim 14 wherein said controller is further adapted, prior to applying said at least one more erase pulse to said at least one bit, to erase verify said at least one bit with a second erase verify level, said second erase verify level not being at a higher voltage level than said first erase verify level.

22. The array according to claim 21 wherein said controller is adapted to apply at least one more erase pulse to said at least one bit only if said bit has passed said first erase verify level and failed said second erase verify level.

23. The array according to claim 14 wherein said controller is adapted to apply at least one more erase pulse to said at least one bit after waiting a period of time.

24. The array according to claim 21 wherein said controller is adapted to apply at least one more erase pulse to said at least one bit after waiting a period of time.

25. The array according to claim 14 wherein said controller is adapted to apply erase pulses with hot hole injection.

26. The array according to claim 14 wherein said memory cells comprise nitride read only memory (NROM) cells.

* * * * *